United States Patent [19]

Gill et al.

[11] 4,270,099
[45] May 26, 1981

[54] CIRCUIT ARRANGEMENT FOR GENERATING AND STABLY AMPLIFYING BROADBAND RF SIGNALS

[75] Inventors: Hardial S. Gill; Othmar Tegel, both of Backnang, Fed. Rep. of Germany

[73] Assignee: Licentia Patent-Verwaltungs-G.m.b.H., Frankfurt am Main, Fed. Rep. of Germany

[21] Appl. No.: 49,158

[22] Filed: Jun. 18, 1979

[30] Foreign Application Priority Data

Jun. 19, 1978 [DE] Fed. Rep. of Germany ....... 2826767

[51] Int. Cl.³ .............................................. H03B 9/14
[52] U.S. Cl. ..................................... 331/96; 330/287; 330/56; 331/107 DP
[58] Field of Search .............. 331/96, 107 DP, 117 D; 330/287, 286, 56

[56] References Cited

U.S. PATENT DOCUMENTS 4,063,186 12/1977 Rubin .................................... 330/287

FOREIGN PATENT DOCUMENTS 2710164 9/1978 Fed. Rep. of Germany .

OTHER PUBLICATIONS

Eddolls et al., "High-Power High-Efficiency C.W. Gunn Oscillators In X Band", Electronics Letters, vol. 7, No. 16, Aug. 12, 1971, pp. 472, 473.
Downing et al., "Q Band (38 GHz) Varactor-Tuned Gunn Oscillators", Electronics Letters, vol. 9, No. 11, May 31, 1973, pp. 244, 245.
Akaike et al., "Millimeter-Wave Broad-Band Solid-State Circuits", Review of the Electrical Communications Laboratories, vol. 25, Nos. 9-10, Oct. 1977, pp. 997-1014.
Séne et al., "A Wide-Band Gunn-Effect C.W. Waveguide Amplifier", IEEE Transactions on Microwave Theory and Techniques, vol. MTT-20, No. 10, Oct. 1972, pp. 645-650.
Gupta, "Large-Signal Equivalent Circuit for IMPATT-Diode", IEEE Transactions on Microwave Theory and Techniques, vol. MTT-21, No. 11, Nov. 1973, pp. 689-694.

*Primary Examiner*—Siegfried H. Grimm
*Attorney, Agent, or Firm*—Spencer & Kaye

[57] ABSTRACT

A circuit arrangement for generating and stably amplifying broadband rf signals. The circuit arrangement includes a first rectangular waveguide designed for operation in a frequency range below its cutoff frequency and a second rectangular waveguide for operation at the operating frequency. An active semiconductor element is disposed in the first rectangular waveguide and a direct voltage is supplied to the semiconductor element. At least one waveguide section is provided for connecting the first and second rectangular waveguides and has the same width as the second rectangular waveguide and a height less than the second rectangular waveguide. The waveguide section matches the cross section of the first rectangular waveguide to the cross section of the second rectangular waveguide. A plurality of tuning devices are disposed in the first rectangular waveguide and the waveguide section and include a capacitively acting tuning screw and an inductively acting tuning device, the latter being disposed in an end of the first rectangular waveguide remote from the waveguide section.

7 Claims, 7 Drawing Figures

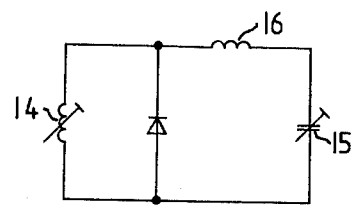
FIG.5
FIG.6
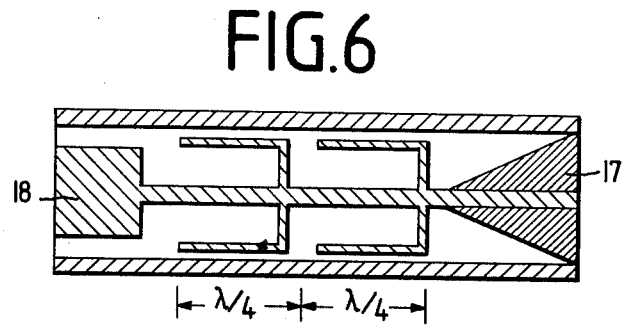
FIG.7
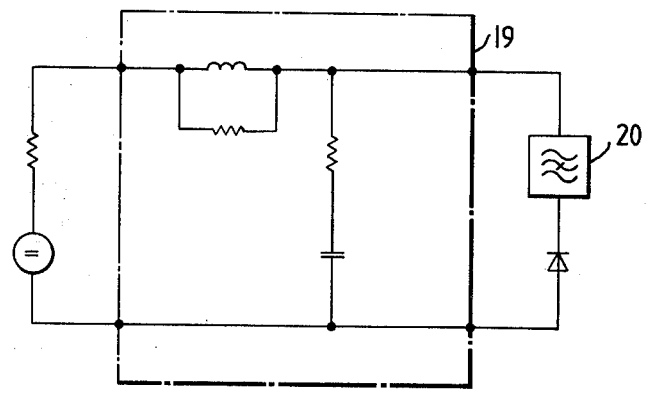

CIRCUIT ARRANGEMENT FOR GENERATING AND STABLY AMPLIFYING BROADBAND RF SIGNALS

BACKGROUND OF THE INVENTION

The present invention relates to a circuit arrangement for generating and stably amplifying broadband rf signals, the arrangement including in a single or multicircuit design, one or a plurality of active semiconductor elements and one or a plurality of tuning devices which are arranged in a rectangular waveguide designed for the operating frequency range and operated below the cutoff frequency.

In order to generate and amplify rf signals with semiconductor elements there are available, in addition to bipolar transistors for frequencies up to about 5 GHz mainly FET transistors as well as Gunn and IMPATT diodes for higher frequency ranges.

If, for example, more than 1000 voice channels or other broadband signals are to be transmitted in frequency division multiplex systems with less than 1 W output power together with high stage gain (20 dB) in a frequency range greater than 5 GHz, injection synchronized IMPATT (impact avalanche and transit time) oscillators are employed. To meet these requirements, it is necessary to provide synchronizing bandwidths of more than 100 MHz in order to assure distortion-free transmission. The relationship between synchronizing bandwidth $B_{sync}$, the ratio of input and output power (stage gain) $P_{in}/P_{out}$, the frequency of the idling oscillator $f_0$ and the external quality factor $Q_e$, are given for the injection synchronized oscillator by the known equation $$B_{sync} = \frac{2f_o}{Q_e} \left( \frac{P_{in}}{P_{out}} \right)^{\frac{1}{2}}$$

Gunn and IMPATT diodes are also used in broadband reflection amplifiers. The principal structure, which is the same for the injection synchronized oscillator or the reflection amplifier, repectively, is shown in FIG. 1 in the circuit arrangement 1 connected to one terminal of the circulator. This circuit arrangement 1 comprises one or a plurality of active semiconductor elements—e.g. Gunn or IMPATT diodes.

Basic equivalent circuit diagrams of IMPATT and Gunn diodes with housing are shown in FIGS. 2a and 2b. In FIG. 2a, network 2 constitutes the equivalent circuit for the IMPATT diode with negative resistance 3, and network 4 constitutes the equivalent valent circuit for the diode housing (see M.S. Gupta: "Large Signal Equivalent Circuit for IMPATT Diode Characterization and its Application to Amplifiers", IEEE Trans. Microwave Theory Tech. Vo. MTT-21, November 1973, pages 689-694).

FIG. 2b shows the equivalent circuit 5 for the Gunn diode with the negative resistance 6 (see Gunn Diode Circuit Handbook, Microwave Association/HB 9000/February 1971, page 8) and the equivalent circuit 7 for the housing. The input impedance of the two equivalent circuits is assumed to be $Z_D = R_D + jX_D$, where $R_D$ takes on a negative value because of the negative resistance of the IMPATT or Gunn diode, respectively. The reactance $X_D$ may be capacitive as well as inductive.

In the region where the amplifier stage is to have a stable gain G according to the known equation $$G = \left( \frac{R_L + R_D}{R_L - R_D} \right)^2$$

where $R_L$ is the load resistance, a circuit arrangement must be provided in the area of the active semiconductor elements for compensating the reactance $X_D$ by the reactive component of the load $X_L$ ($X_L = -X_D$). Difficulties exist principally in carrying out the compensation over a broad frequency band since, on the one hand, the effective resistance of the diode may be very low, for example, the resistance of a typical IMPATT diode is $\leq \theta 0.8 \, \Omega$, and the inductive or capacitive reactive component may be relatively high $(20\Omega–40\Omega)$, which corresponds to a high diode Q of about 20. Moreover, the diodes with their housing constitute multicircuit arrangements as shown in FIGS. 2a and 2b, whose impedance additionally changes considerably due to fluctuations in manufacture and the selection of the operating point or the degree of modulation (the difference between small and large signal operation).

HP Application Note 935 3/1972 describes injection synchronized oscillators and reflection amplifiers which employ coaxial or coaxial waveguide arrangements in which the compensation of the diode reactance is usually effected in a single circuit. Multicircuit coaxial and stripline circuits are also known in which, however, no sufficient matching possibilities are given to sufficiently handle changes in frequency, and fluctuations in semiconductors due to fabrication. These arrangements attain external Q's which do not meet the requirements of broadband compensation of the diode reactance.

A broadband microwave oscillator has been disclosed in German patent application P 27 10 164.0. This oscillator includes a waveguide operated below the cutoff frequency and having a longitudinal slit in the narrow side of the waveguide through which the energy is coupled out into a coupling waveguide whose cross section permits the existence of the coupled-out fundamental mode. In the vicinity of the region where the energy is coupled out into the coupling waveguide there is disposed the active semiconductor device and at least one additional variable capacitance. Although it is possible with the aid of these arrangements to achieve a smaller external Q than with the prior art solutions, an external Q has not been realized which is less than the Q of the semiconductor element. To transmit, for example, 1800 calls with an injection synchronized oscillator having a stage gain of 20 dB, it is necessary, according to the relationship between synchronizing bandwidth, external Q and stage gain (see the equation above) to have an external quality factor of $Q_e \leq 10$, which then lies far below the inherent Q ($\simeq 20$) of, for example, an IMPATT diode. The above circuit arrangement can also be realized only with difficulty in multiple circuit arrangements and is difficult to tune in that case.

SUMMARY OF THE INVENTION

It is therefore an object of the present invention to provide a single or multiple circuit arrangement which is designed either as an injection synchronized rf power oscillator for the transmission of broadband signals or as a broadband stable reflection amplifier of simple design. This arrangement has good matching possibilities so as to realize external Q's which are less than the inherent Q of the semiconductor devices.

The objective is accomplished by the present invention in a circuit arrangement for generating and stably amplifying broadband rf signals. The circuit arrangement includes a first rectangular waveguide designed for operation in a frequency range below its cutoff frequency and a second rectangular waveguide for operation at the operating frequency. An active semiconductor element is disposed in the first rectangular waveguide and a direct voltage is supplied to the semiconductor element. At least one waveguide section is provided for connecting the first and second rectangular waveguides and has the same width as the second rectangular waveguide and a height less than the second rectangular waveguide. The waveguide section matches the cross section of the first rectangular waveguide to the cross section of the second rectangular waveguide. A plurality of tuning devices are disposed in the first rectangular waveguide and the waveguide section and include at least one capacitively acting tuning screw and an inductively acting tuning device, the latter being disposed in an end of the first rectangular waveguide remote from the waveguide section. The inductively active tuning device can be a shorting plunger or a short with a displaceable dielectric.

An advantageous further embodiment of the circuit provides that the capacitively acting tuning screws are arranged on both sides of the semiconductor element in the first rectangular waveguide operated below its cutoff frequency and/or in the one or more waveguide sections serving to match the cross sections.

In an additional embodiment of the invention the direct voltage is supplied via a band-stop filter with λ/4 coupling disposed directly at the semiconductor element. The band-stop filter has an integrated absorber and a transforming section. A biasing circuit is provided between the d.c. source and the band-stop filter, particularly if an IMPATT diode is used as the active semiconductor element.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings wherein:

FIG. 5 shows the equivalent circuit of the arrangement of FIGS. 3 and 4.

FIG. 6 shows a band-stop filter which is disposed directly at the diode in order to suppress oscillations outside the operating range.

FIG. 7 shows a biasing circuit, particularly for IMPATT diodes, to suppress oscillations in the lower frequency ranges.

DESCRIPTION OF THE PREFERRED EMBODIMENTS

Figure 1:
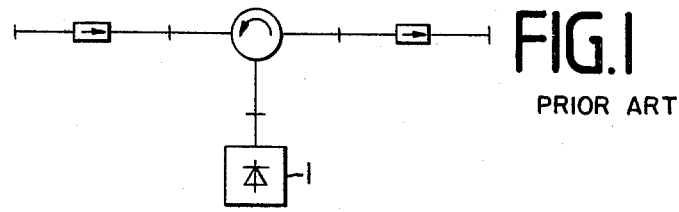
FIG. 1 shows the basic design of an injection synchronized oscillator or a reflection amplifier.
Figure 2A:
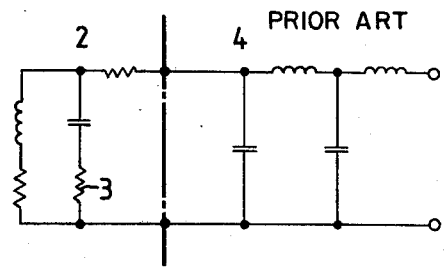
FIGS. 2a and 2b are known equivalent circuit diagrams for the IMPATT diode (FIG. 2a) and the Gunn diode (FIG. 2b) respectively, and their housings.
Figure 2B:
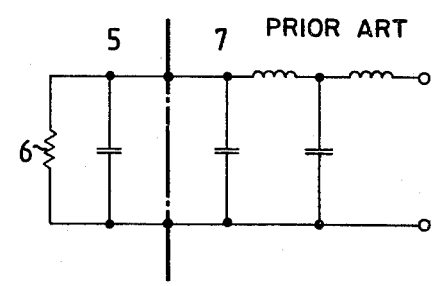
Figure 3:
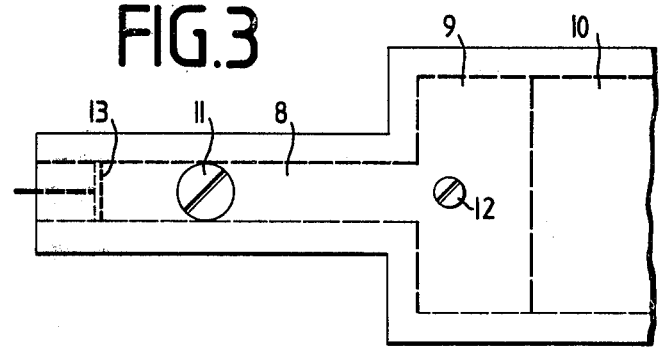
FIG. 3 is a top view of an embodiment of the circuit arrangement of this invention for an injection synchronized oscillator or reflection amplifier.
Figure 4:
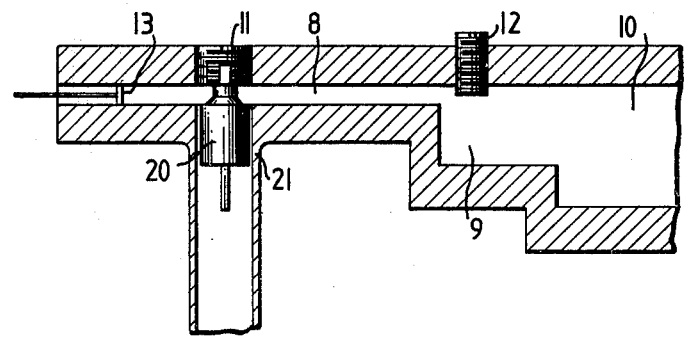
FIG. 4 is a side view of the circuit arrangement of FIG. 3.

Referring now to the drawings, FIGS. 3 and 4 show a waveguide arrangement which includes a waveguide 8 designed to operate in an operating frequency range below the cutoff frequency and a transition section 9 for cross-sectional matching to a waveguide 10 which is designed for the operating frequency. The waveguide 8 has a height and width which is less than that of the waveguide 10. The circuit shown here is a dual-circuit arrangement including an inductively coupled diode 11 in the waveguide 8 operated below the cutoff frequency and a capacitively acting tuning screw 12 disposed in the transition section 9. As inductively acting tuning device, a shorting plunger 13 is attached to the side of the waveguide 8 facing away from its output. In addition to influence by the tuning devices, tuning screw and shorting plunger, the compensation of the diode reactance is influenced by the tuning dimensions of the waveguide 8 operated below the cutoff frequency and of the transition section 9 as well as by the distance between the diode 11 and the tuning screw 12.

FIG. 5 shows the equivalent circuit of the dual-circuit arrangement in which the variable 14 which is connected in parallel with the diode represents the effect of the shorting plunger 13, and the variable capacitance 15 represents the effect of the tuning screw 12. The inductance 16 connected in the longitudinal branch characterizes the waveguide dimensions and the distance between diode and tuning screw.

Since some of the semiconductor devices in question offer a negative resistance not only in the operating frequency range but also down to very low frequencies and up to very high frequencies, it is necessary to prevent oscillations outside the operating range by means of an appropriate circuit. For this purpose, a multi-circuit coaxial band-stop filter is employed.

FIG. 6 shows a dual-circuit λ/4 coupled band-stop filter having an integrated terminating resistance 17 and a transforming section 18 which is short-circuited directly with the diode plane. FIG. 4 shows how the band-stop filter 20 is disposed in a device 21 for supplying the direct voltage to the diode 11. The d.c. supply, which comes from constant voltage or constant current sources depending on the type of semiconductor element involved, i.e. a Gunn diode or an IMPATT diode, must be supplemented by an additional circuit, particularly in the case of IMPATT diodes, so that low frequency oscillations in the direct voltage supply, which are no longer blocked by the band-stop filter, are avoided. Such a biasing circuit 19 is connected to band-stop filter 20 as shown in FIG. 7.

The above-described circuit arrangement has the advantage of a simple, concentrated structure and makes it possible, with relatively simple means, to accommodate a sufficient number of tuning elements to supply single or multi-circuit circuits. Even the simple, dual-circuit arrangement of the preferred embodiment is capable of reaching external Q's which lie far below the inherent Q of the diode. In an actual reduction to practice, an injection synchronized oscillator employing such a circuit and an IMPATT diode which has an inherent Q of about 25 in the 6 GHz range, furnished the following data: output power $\geq 2$ W; gain $\geq 20$ dB; sync bandwidth $\geq 150$ MHz; external $Q \leq 10$, tuning range in the rf plane $\geq 10\%$.

Figure 3A:
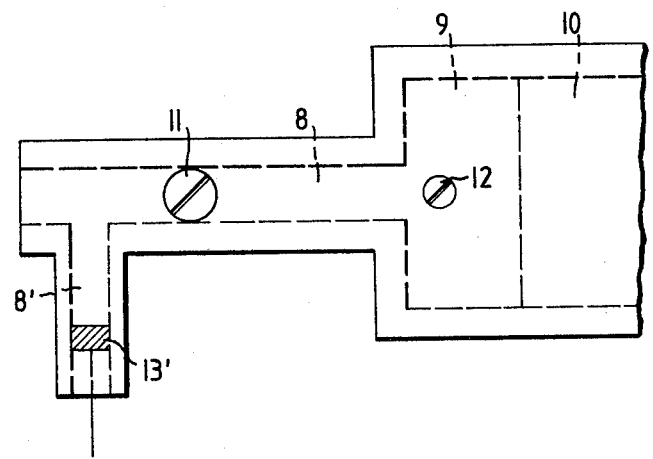
FIG. 3a is a top view of an injection synchronized oscillator or reflection amplifier with an adjustable short and a displaceable dielectric therein.
Figure 3B:
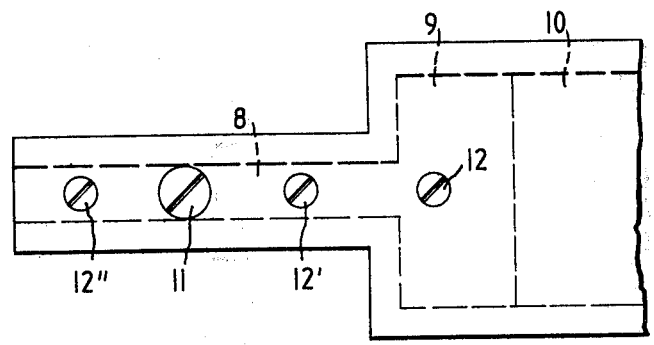
FIG. 3b is a top view of an injection synchronized oscillator or reflection amplifier with an adjustable short with tuning screws in the waveguide operating below its cutoff frequency.

FIG. 3a shows a waveguide arrangement which has as an inductively acting tuning device, an adjustable short 8' with a displaceable dielectric 13' attached to one long side of the waveguide 8 between the diode 11 and the end of the waveguide 8. FIG. 3b shows the waveguide arrangement with two capacitively acting tuning screws 12' and 12" disposed in the below cutoff waveguide 8 on both sides of the diode 11.

The stepped shape of the transition section 9 (EH-step transformer) is significant because the ratio of the dimension of this section 9 and of the below cutoff waveguide 8 influences the transformation of the reactance and the frequency.

It is to be understood that the above description of the present invention is susceptible to various modifications, changes and adaptations, and the same are intended to be comprehended within the meaning and range of equivalents of the appended claims.

What is claimed is:

1. A circuit arrangement for generating and stably amplifying broadband rf signals comprising:

A first rectangular waveguide for operation in a frequency range below its cutoff frequency;

An active semiconductor element disposed in the first rectangular waveguide;

Means for supplying a direct voltage to the semiconductor element;

A second rectangular waveguide for operation at the operating frequency, said first rectangular waveguide having a height and width which is less than that of the second rectangular waveguide;

At least one waveguide section connecting the first and second rectangular waveguides and having the same width as the second rectangular waveguide and a height less than the height of the second rectangular waveguide, the waveguide section matching the cross section of the first rectangular waveguide to the cross section of the second rectangular waveguide; and A plurality of tuning devices disposed in the first rectangular waveguide and the waveguide section, the tuning devices including at least one capacitively acting tuning screw and an inductively acting tuning device, the inductively acting tuning device being disposed in an end of the first rectangular waveguide remote from the waveguide section.

2. The circuit arrangement recited in claim 1 wherein the inductively acting tuning device is a shorting plunger.

3. The circuit arrangement recited in claim 1 wherein the inductively acting tuning device is an adjustable short with a displaceable dielectric.

4. The circuit arrangement recited in claim 1 wherein the capacitively acting tuning screw is disposed in the waveguide section.

5. The circuit arrangement recited in claim 1 wherein capacitively acting tuning screws are disposed in the first waveguide on both sides of the semiconductor element.

6. The circuit arrangement recited in claim 1 including:

a dual circuit $\lambda/4$ coupled band-stop filter having an integrated absorber and a transforming section and disposed in the means for supplying a direct voltage to the semiconductor element.

7. The circuit arrangement recited in claim 6 wherein the semiconductor element is an IMPATT diode; and including a biasing circuit connected to the band-stop filter.

* * * * *